United States Patent
Lee et al.

(10) Patent No.: US 8,324,646 B2
(45) Date of Patent: *Dec. 4, 2012

(54) CHIP COATED LIGHT EMITTING DIODE PACKAGE AND MANUFACTURING METHOD THEREOF

(75) Inventors: Seon Goo Lee, Gyunggi-Do (KR); Kyung Taeg Han, Gyunggi-Do (KR); Seong Yeon Han, Gwangjoo (KR)

(73) Assignee: Samsung Electronics Co., Ltd., Seoul (KR)

( * ) Notice: Subject to any disclaimer, the term of this patent is extended or adjusted under 35 U.S.C. 154(b) by 3 days.

This patent is subject to a terminal disclaimer.

(21) Appl. No.: 12/842,493

(22) Filed: Jul. 23, 2010

(65) Prior Publication Data
US 2010/0289051 A1 Nov. 18, 2010

Related U.S. Application Data

(60) Continuation of application No. 12/684,578, filed on Jan. 8, 2010, now Pat. No. 7,795,052, which is a division of application No. 11/651,524, filed on Jan. 10, 2007, now Pat. No. 7,714,342.

(30) Foreign Application Priority Data

Jan. 10, 2006 (KR) .................... 10-2006-0002829

(51) Int. Cl.
*H01L 33/00* (2010.01)
(52) U.S. Cl. ....... 257/98; 257/79; 257/99; 257/E33.056; 257/E33.059
(58) Field of Classification Search ............. 257/81, 257/82, 91, 98, 99, 100, 116, 117, 432–437, 257/749, E33.056–E33.059, E25.032
See application file for complete search history.

(56) References Cited

U.S. PATENT DOCUMENTS

| | | |
|---|---|---|
| 2002/0064935 A1 | 5/2002 | Honda |
| 2005/0082561 A1 | 4/2005 | Suehiro et al. |
| 2006/0022215 A1 | 2/2006 | Arndt et al. |
| 2006/0027936 A1 | 2/2006 | Mizukoshi et al. |

FOREIGN PATENT DOCUMENTS

JP 2002118293 A 4/2002

(Continued)

OTHER PUBLICATIONS

United States Office Action issued in U.S. Appl. No. 12/684,614, mailed Aug. 17, 2010.
Japanese Decision of Rejection, with English Translation, issued in Japanese Patent Application No. 2007-001964, dated Jan. 25, 2011.
Japanese Office Action, and English translation thereof, issued in Japanese Patent Application No. 2010-240608 dated May 15, 2012.

(Continued)

*Primary Examiner* — N Drew Richards
*Assistant Examiner* — Mamadou Diallo
(74) *Attorney, Agent, or Firm* — McDermott Will & Emery LLP

(57) ABSTRACT

A chip coated LED package and a manufacturing method thereof. The chip coated LED package includes a light emitting chip composed of a chip die-attached on a submount and a resin layer uniformly covering an outer surface of the chip die. The chip coated LED package also includes an electrode part electrically connected by metal wires with at least one bump ball exposed through an upper surface of the resin layer. The chip coated LED package further includes a package body having the electrode part and the light emitting chip mounted thereon. The invention improves light efficiency by preventing difference in color temperature according to irradiation angles, increases a yield, miniaturizes the package, and accommodates mass production.

25 Claims, 3 Drawing Sheets

FOREIGN PATENT DOCUMENTS

| | | |
|---|---|---|
| JP | 2002-170998 | 6/2002 |
| JP | 2005-033138 | 2/2005 |
| WO | WO-03/034508 A1 | 4/2003 |
| WO | WO 2004/040661 A2 | 5/2004 |

OTHER PUBLICATIONS

United States Office Action issued in U.S. Appl. No. 12/684,614, mailed Oct. 7, 2010.
United States Office Action issued in U.S. Appl. No. 12/684,614, mailed Apr. 1, 2011.

CHIP COATED LIGHT EMITTING DIODE PACKAGE AND MANUFACTURING METHOD THEREOF

CROSS-REFERENCE TO RELATED APPLICATIONS

This application is a Continuation of U.S. application Ser. No. 12/684,578, filed on Jan. 8, 2010 now U.S. Pat. No. 7,795,052, which is a Divisional of U.S. application Ser. No. 11/651,524, filed on Jan. 10, 2007, now U.S. Pat. No. 7,714,342, claiming priority of Korean Patent Application No. 10-2006-0002829, filed on Jan. 10, 2006, the entire contents of each of which are hereby incorporated by reference.

BACKGROUND OF THE INVENTION

1. Field of the Invention

The present invention relates to a chip coated Light Emitting Diode (LED) package and a manufacturing method thereof and, more particularly, to a chip coated LED package which increases light extraction efficiency, accommodates miniaturization of a product and reduces manufacturing costs, and to a manufacturing method thereof.

2. Description of the Related Art

In general, a Light Emitting Diode (hereinafter referred to as 'LED') is an electric component which converts electric energy to light energy from recombination of minority carriers (electrons and holes) injected through a p-n junction structure of semiconductor and thereby emits the light. That is, when a forward voltage is applied to a semiconductor of a particular element, electrons and holes migrate through the junction of an anode and a cathode and recombine with each other. The recombined state has a smaller energy than when the electrons and the holes are separated from each other. Using this difference in energy, the LED emits light.

The range of light generated from the LED is from a red region (630 nm to 780 nm) to a blue-Ultraviolet region (350 nm) including blue, green and white. As the LEDs have advantages such as low power consumption, high efficiency, prolonged operation and lifetime, the demand therefor has been increasing.

In addition, the range of application of the LEDs has been expanded from small-sized illumination of mobile terminals to indoor/outdoor illumination, automobile illumination and backlights for large-sized Liquid Crystal Displays (LCDs).

FIG. 1 is a longitudinal sectional view illustrating a conventional LED package. As shown, the conventional LED package 10 includes a package body 11 having an upwardly-open cavity formed therein, a lead frame 12 provided integrally to the package body 11, a light emitting chip 14, which is a light emission source for generating light when power is applied, wired bonded by a plurality of metal wires 15 so as to be electrically connected to the lead frame 12 and a transparent resin encapsulant 17 filled in the cavity to protect the light emitting chip and the metal wires from the outside environment.

The transparent resin encapsulant 17 is made of a transparent resin such as epoxy to pass the generated light to the outside.

In the meantime, in a case where the light emitting chip 14 is provided as a blue light emitting device, a fluorescent material is included in the transparent resin encapsulant 17 to obtain desired white light.

Such a fluorescent material is a wavelength-converting means that converts a first wavelength of blue light emitted from the light emitting chip 14 to a second wavelength of white light. The fluorescent material is made of Yitrium Aluminum Garnett (YAG)-based, Terbium Aluminum Garnett (TAG)-based, or silicate-based powder, and is mixed in the transparent resin, the main substance of the transparent resin part 17.

However, in the process of irradiating the blue light generated from the light emitting chip 14 to the outside, beams of the blue light propagate for different lengths before being converted into white light due to the structure of the transparent resin encapsulant 17 containing the fluorescent material. This adversely causes non-uniform color temperature according to the irradiation angles of white light.

Moreover, in this structure, the light emitting chip 14 and the metal wires 15 come in contact with the YAG-based, TAG-based and Silicate-based fluorescent material contained in the transparent resin encapsulant 17. Thus, made of heavy metal-based powder having electric conductivity, the YAG-based, TAG-based and Silicate-based fluorescent material may cause leakage current degrading the light efficiency of the light emitting chip 14 during light emission, ultimately undermining the reliability of the package.

Therefore, as an approach to prevent leakage current due to the contact between the fluorescent material contained in the transparent resin encapsulant and the metal wires 15, the light emitting chip 14 is flip-chip bonded on a submount (not shown) via a plurality of bump balls, the submount is mounted on the lead frame 12 of the package body 11, and the submount and the lead frame 12 are wire bonded by the metal wires so as to be electrically connected to each other.

Then, the transparent resin containing the fluorescent material is filled in the cavity of the package body 11 or is applied to cover only the light emitting chip 14 flip chip bonded on the submount, thereby forming the transparent resin encapsulant 17.

However, in this structure of wire bonding the submount having the light emitting chip 14 mounted thereon with the lead frame 12, it is necessary to ensure a sufficient size of the submount to which the ends of the metal wires are bonded. This limits miniaturization of the package, complicates the manufacturing process and increases the manufacturing costs.

SUMMARY OF THE INVENTION

The present invention has been made to solve the foregoing problems of the prior art and therefore an aspect of the present invention is to provide a chip coated Light Emitting Diode (LED) package which can improve light efficiency by preventing differences in color temperature according to irradiation angles, increase a yield, and allows miniaturization and accommodate mass production, and a manufacturing method thereof.

According to an aspect of the invention, the invention provides a chip coated Light Emitting Diode (LED) package. The LED package includes: a light emitting chip including a chip die attached to a submount and a resin layer covering an outer surface of the chip die; at least one bump ball provided on the chip die and exposed through an upper surface of the resin layer and an electrode part electrically connected to the at least one bump ball by a metal wire; and a package body having the electrode part and the light emitting chip mounted thereon.

Preferably, the resin layer contains a fluorescent material for converting the light generated from the chip die.

Preferably, the electrode part is provided as a lead frame integrally provided to the package body.

Preferably, the package body is a resin structure which is injection molded with resin to have a cavity formed therein, the cavity for exposing the electrode part with the light emitting chip mounted thereon.

More preferably, the cavity includes a reflecting part formed on an inner surface thereof for reflecting the light generated from the light emitting chip.

More preferably, the cavity includes a filler made of transparent resin filled therein and the package body further includes a lens provided on an upper part thereof.

Preferably, the package body has a disposition hole formed therein, the disposition hole exposing a metallic chassis with the light emitting chip mounted thereon, and the package body is provided as a substrate having the electrode part pattern-printed on an upper surface thereof.

More preferably, the disposition hole includes a reflecting part formed on an inner surface thereof for reflecting the light generated from the light emitting chip.

More preferably, the disposition hole includes a filler made of transparent resin filled therein and the package body further includes a lens provided on an upper part thereof.

According to another aspect of the invention, the invention provides a method of manufacturing a chip coated Light Emitting Diode (LED) package. The method includes: die attaching a plurality of chip dies on a wafer; providing at least one bump ball on an upper surface of each of the chip dies; forming a resin layer to cover the chip dies including the bump balls; polishing an upper surface of the resin layer to expose the bump balls; and cutting the wafer and the resin between the chip dies into individual light emitting chips.

Preferably, the step of forming a resin layer includes printing a resin material on the wafer to cover the chip dies including the bump balls and thermally curing the printed resin layer.

Preferably, the resin layer is made of a resin material containing a fluorescent material for converting the wavelength of light generated from the chip dies.

Preferably, the method further includes: mounting each of the light emitting chips composed of the chip die mounted on a submount and the resin layer covering an outer surface of the chip die on an electrode part of a package body formed by injection molding to have an upward-opening cavity, and wire bonding the light emitting chip with the electrode part provided as a lead frame by a metal wire.

Preferably, the method further includes: mounting each of the light emitting chips composed of a chip die mounted on a submount and a resin layer covering an outer surface of the chip die on an upper surface of a metallic chassis, and wire bonding the light emitting chip with the electrode part provided as an electrode pattern formed on an upper surface of the package body having a disposition hole formed therein, the disposition hole exposing the light emitting diode chip, by a metal wire.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
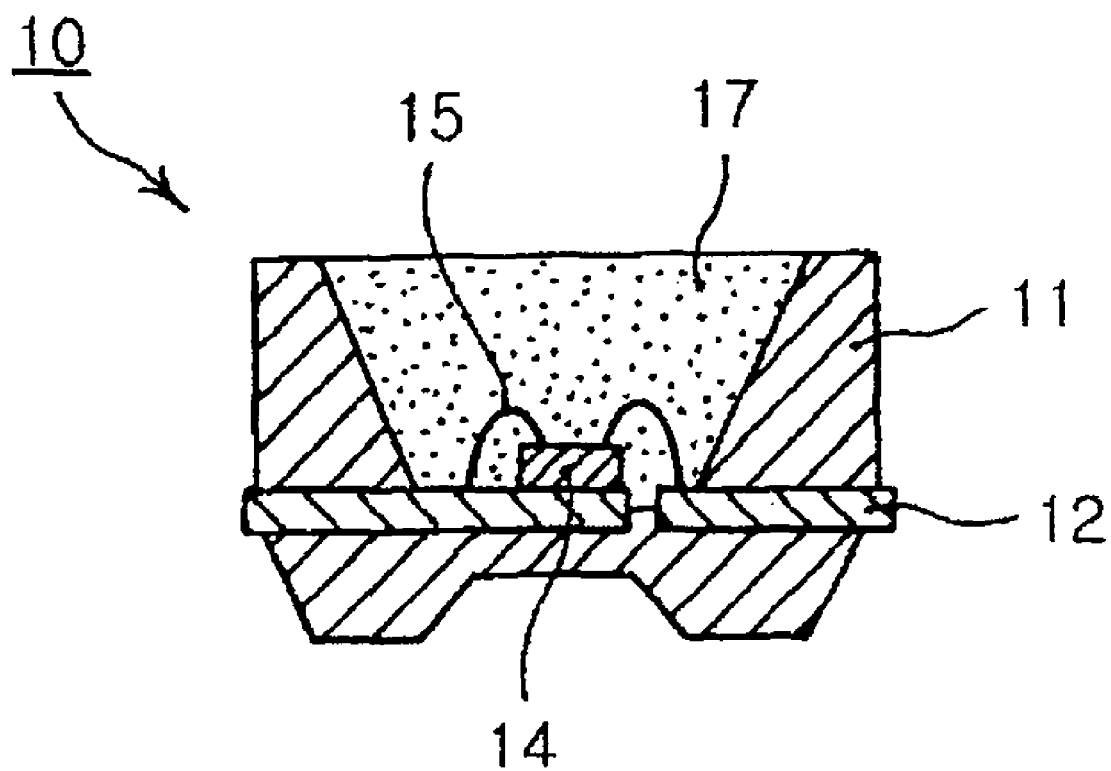
FIG. 1 is a longitudinal sectional view illustrating a conventional LED package.
Figure 2:
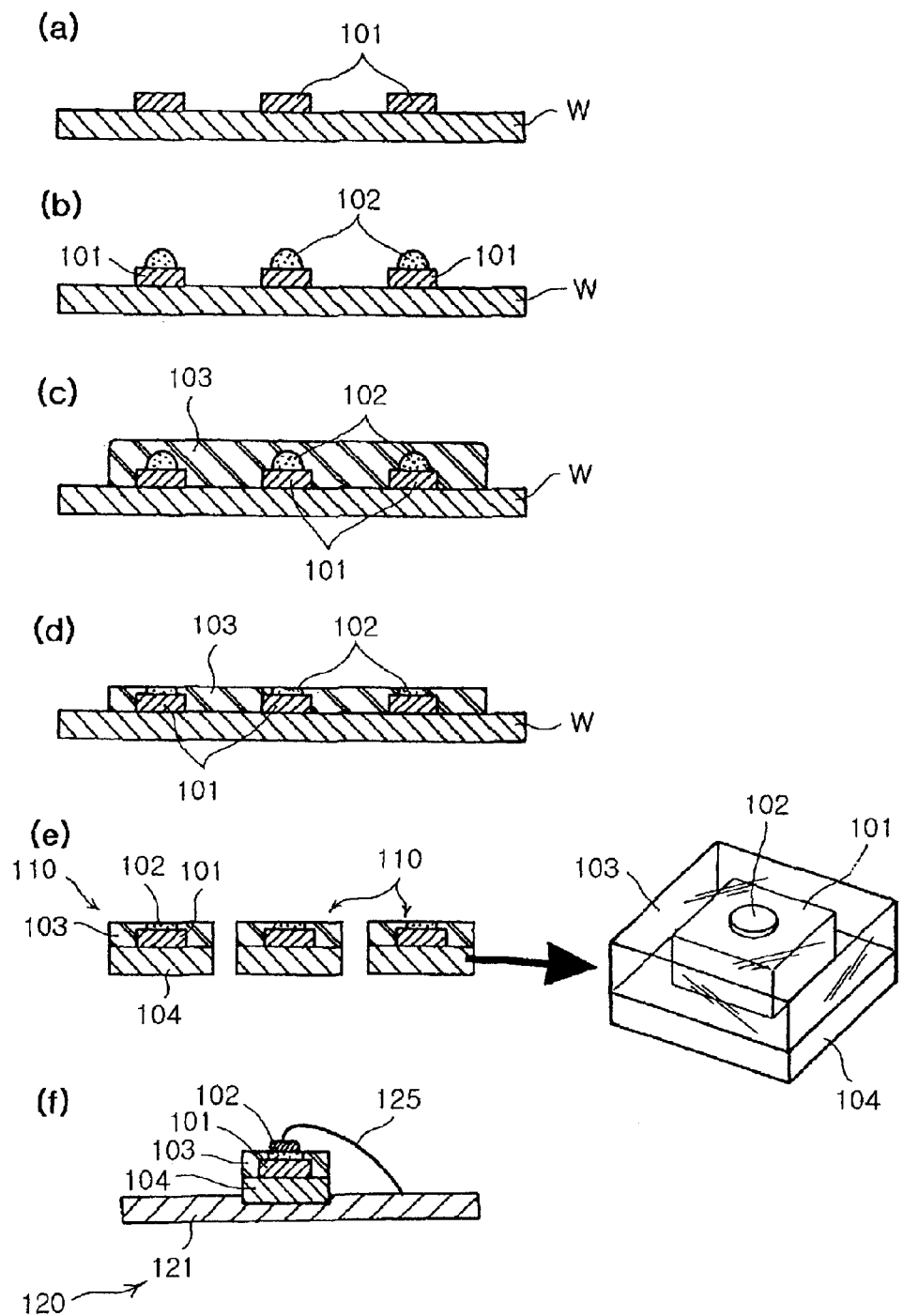
FIGS. 2(a) to (f) is a view illustrating a manufacturing process of an LED package according to the present invention.
Figure 3:
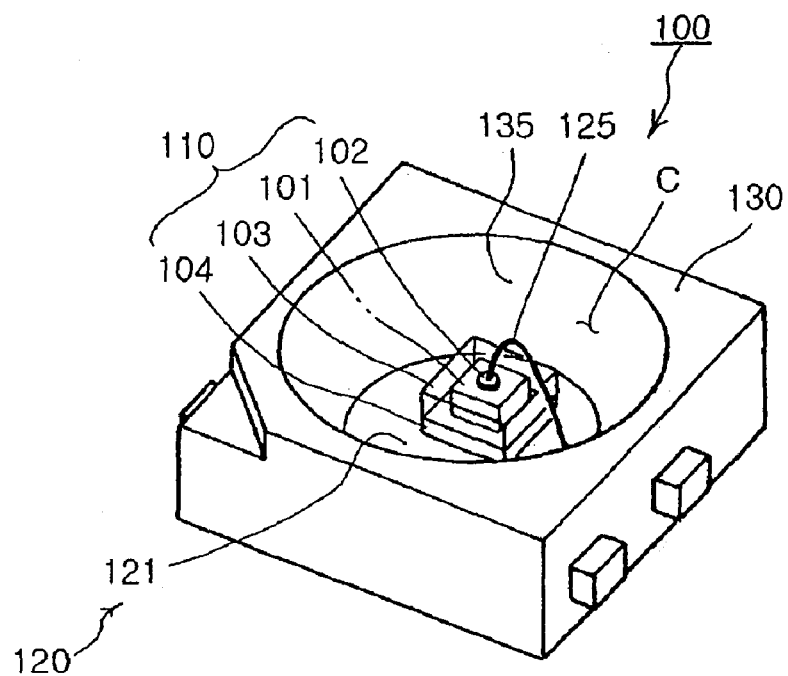
FIG. 3 is a perspective view illustrating a chip coated LED package according to a first embodiment of the present invention.

FIGS. 2(a) to (f) is a view illustrating the fabrication of a chip coated LED package according to the present invention and FIG. 3 is a perspective view illustrating a chip coated LED package according to a first embodiment of the present invention.

The LED package 100 according to the present invention includes a light emitting chip 110, an electrode part 120 and a package body 130.

The light emitting chip 110 includes a chip die 101, a bump ball 102, a resin layer 103 and a submount 104. The chip die 101, which is die-attached on the submount 104, is a light emitting source for generating light when power is applied.

Here, the chip die 101 is a light emitting source for generating near ultraviolet rays or blue light when power is applied. For such a chip die 101, it is preferable to use a gallium nitride-based light emitting diode chip which generates blue light with high output and high luminance. The chip die 101 can adopt a horizontal structure in which both p- and n-electrodes are formed on an upper surface thereof or a vertical structure in which p- and n-electrodes are formed on upper and lower surfaces thereof, respectively.

In addition, the gallium nitride-based light emitting diode chip is a well-known semiconductor device, and thus an explanation on the specific configuration thereof is omitted.

The chip die 101, which is mounted on the submount 104, has a bump ball 102 provided on an upper surface thereof. The bump ball 102 is electrically connected to the electrode part 120. There may be provided a single bump ball 102 or two bump balls 102 depending on the structure of the chip die 101.

That is, the number of bump balls 102 varies depending on the structure of the chip die 101. If the chip die 101 has a vertical structure with the p- and n-electrodes formed on upper and lower surfaces, respectively, there may be provided a single bump ball 102 which electrically connected to the p-electrode formed on an upper surface of the chip die 101.

If the chip die 101 has a horizontal structure with the p- and n-electrodes both formed on an upper surface thereof, there may be provided two bump balls 102, each electrically connected to each of the p- and n-electrodes formed on an upper surface of the chip die 101.

In addition, the resin layer 103 is made of a transparent resin material such as epoxy and silicone that covers an outer surface of the chip die 101 die-attached on the submount 104.

Here, the resin layer 103 contains fluorescent material, a means for converting the wavelength, one selected from the group consisting of YAG-based, TAG-based and Silicate-based materials, capable of converting the light generated from the chip die into white light.

In addition, the electrode part 120 is electrically connected to at least one bump ball 102 exposed through an upper surface of the resin layer 103, by a metal wire 125.

Figure 4:
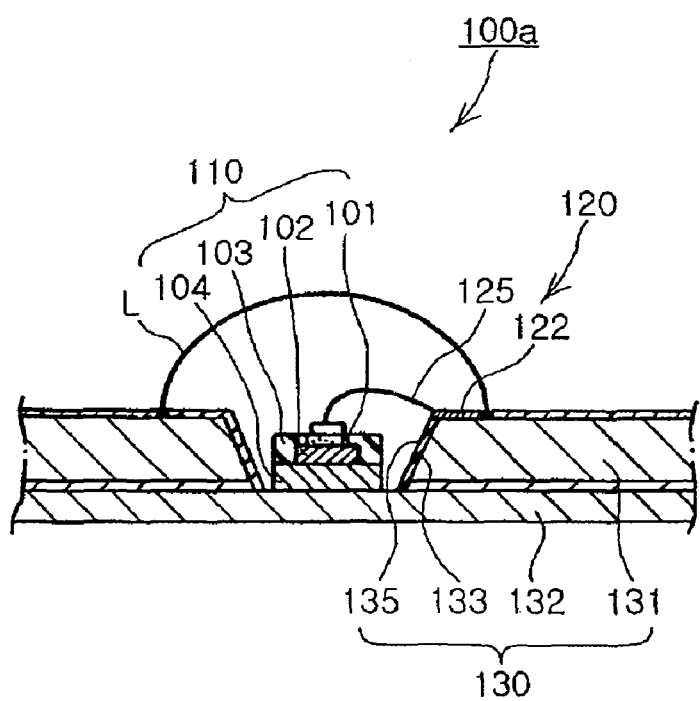
FIG. 4 is a sectional view illustrating a chip coated LED package according to a second embodiment of the present invention.

As shown in FIG. 3, such an electrode part 120 may provided as a lead frame 121 which is integrally provided to the package body 130, an injection-molded resin structure, and wire bonded with an end of the metal wire 125 having the other end connected to the bump ball 102. This however does not limit the present invention, and as shown in FIG. 4, the electrode part 120 may also be provided as an electrode pattern 122 printed on an upper surface of the substrate 131 constituting the package body 130.

In addition, as shown in FIG. 3, the package body 130 with the light emitting chip 110 electrically connected to the electrode part 120 is a resin structure injection molded with resin to have a cavity C which houses and exposes the electrode part 120 provided as the lead frame 121 to have the light emitting chip 110 mounted thereon.

Such a cavity C includes a reflecting part 135 formed on an inner surface thereof so as to reflect the light generated from the light emitting chip 110. The reflecting part 135 can be formed by evenly coating or depositing a reflecting material made of one selected from the group consisting of Al, Pt, Ti, Cr and Cu having high reflectivity on an entire inclined inner surface of the cavity C. This however does not limit the present invention, and the reflecting part 135 may also be formed by separately attaching a sheet or film made of one selected from the group consisting of Al, Ag, PT, Ti, Cr and Cu having high reflectivity.

In addition, the package body 130 may have a lens L provided on an upper part thereof to widen the beam angle of light generated from the light emitting chip 110 or increase light efficiency. The cavity C enclosed by the lens L may be filled with a filler made of transparent resin so as to protect the light emitting chip 110 and the metal wire 125 from the outside environment.

In the meantime, FIG. 4 illustrates a chip coated LED package according to a second embodiment of the present invention. In this embodiment, the package body 130 of the LED package 100a may include a metal chassis 132 with the light emitting chip 110 mounted thereon and a substrate 131 having a predetermined dimension of disposition hole 133 for exposing the light emitting chip 110 and having the electrode part 120 pattern printed on an upper surface thereof.

Here, the disposition hole 133 may also have a reflecting part 135 for reflecting the light generated from the light emitting chip 110.

In addition, the package body 130 provided in the form of a substrate can also have a lens L provided on an upper part thereof in order to widen the beam angle of light generated from the light emitting chip 110 or increase the light efficiency. A filler made of a transparent resin is filled in the space of the disposition hole 133 enclosed by the lens L.

As shown in FIG. 2(a), a manufacturing method of the LED package with the above described configuration starts with die-attaching a plurality of chip dies 101 manufactured by a semiconductor process on a wafer W.

Here, the wafer W may be made of non-conductive or conductive material depending on the arrangement of the p- and n-electrodes provided on the chip dies 101.

In addition, as shown in FIG. 2(b), at least one bump ball 102 is provided on an upper surface of each of the chip dies 101 die-attached on the wafer W.

There may be provided a single or two bump balls 102 can be provided in one or two depending on the arrangement of the p- and n-electrodes (horizontal or vertical type) on the chip dies 101.

It is preferable that the bump ball 102 is made of a metallic material with excellent thermal conductivity and electric conductivity, such as Au, Al and Cu.

Subsequently, as shown in FIG. 2(c), the step of forming a resin layer 103 on the wafer W includes printing a transparent resin such as silicone and epoxy on the wafer W to cover the plurality of chip dies 101 each with the bump ball 102 provided on an upper surface thereof.

At this time, the transparent resin is printed in a thickness of up to 300 um considering the diameter of the bump ball 102.

In addition, the resin layer 103 printed on the wafer W to cover the chip dies 101 including the bump balls 102 is thermally cured by artificially provided heat.

Here, the resin layer 103 can contain a fluorescent material, a wavelength-converting means, to convert the light emitted from the chip dies 101 into white light in accordance with the emission color of the chip dies 101.

In addition, as shown in FIG. 2(d), an upper surface of the resin layer 103 provided on the wafer W is polished by a polishing means (not shown) to expose the bump balls 102 provided on the chip dies 101. The polishing method can be selected in consideration of precision and productivity, such as using a grinder or cutting with a fly cutter.

At this time, the upper surface of the resin layer 103 should be polished by the polishing means in a uniform thickness in parallel with the surface of the wafer W.

Subsequently, as shown in FIG. 2(e), the wafer W with the chip dies 101 and the resin layer 103 polished to expose the bump balls 102 is cut along horizontal and vertical cut lines between the adjacent chip dies 101 and separated into light emitting chips 110 generating light when power is applied.

Such a light emitting chip 110 is composed of a die-attached chip die 101 provided on a submount cut out of the wafer W, at least one bump ball 102 provided on an upper surface of the chip die 101 and a resin layer 103 exposing the bump ball 102 and uniformly covering an outer surface of the chip die 101.

As shown in FIG. 2(f), the light emitting chip 110 with the above configuration is mounted on an upper surface of the electrode part 120 provided as a lead frame 121, and the electrode part 120 is wire bonded to an end of the metal wire 125 having the other end bonded to the bump ball 102 of the light emitting chip 110.

Here, the electrode part 120 is a metallic member exposed through the cavity C of the package body 130 injection molded with resin to have the upward-opening cavity.

When a forward current is applied to the LED packages 100 and 100a with the above described configurations, the light emitting chip 110 is supplied with current via the electrode part 120, and thereby the chip die 101 of the light emitting chip 110 emits light in a color out of Red R, Green G and Blue B depending on the material of the semiconductor constituting the chip die 101.

In addition, the light generated from the chip die 101 is emitted via the resin layer 103, provided to uniformly cover an outer surface of the chip die 101, to the outside.

At this time, in a case where the resin layer 103 contains a fluorescent material, a first wavelength of the blue light generated from the chip die is converted to a second wavelength of white light by the fluorescent material, allowing the light emitting chip 110 to generate white light.

Here, the resin layer 103 containing the fluorescent material is provided in a uniform thickness over an outer surface of the chip die such that the light generated from the chip die 101 in response to power application has a uniform path passing through the resin layer 103 regardless of the irradiation angles, preventing the difference in color temperature according to the irradiation angles.

In addition, the metal wire 125 is prevented from contacting the fluorescent material made of heavy metal having an electric conductivity, thereby preventing leakage current. This improves the light efficiency of the light emitting chip 110 and prevents deterioration of the thermal characteristics, ultimately improving the product reliability.

Further, the light generated from the light emitting chip 110 is reflected by the reflecting part 135 provided on an inner surfaces of the cavity C or the disposition hole 133, thus emitted in a wider angle to the outside.

According to the present invention set forth above, a resin layer containing a fluorescent material is provided in a uniform thickness over an outer surface of a chip die generating light in response to power application. In addition, a bump ball exposed out of the resin layer is electrically connected to an electrode part by a metal wire. This allows the light passing through the resin layer to have a uniform path irrespective of irradiation angles, preventing difference in color temperature according to the irradiation angles, thereby improving light efficiency.

In addition, the fluorescent material having an electric conductivity is prevented from contacting the metal wire, preventing leakage current exhibited in the prior art, thereby improving product reliability.

Furthermore, the invention allows reducing the size of the package to achieve miniaturization, mass producing with a simple manufacturing process, and reducing the manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A chip coated Light Emitting Diode (LED) package comprising:
   a light emitting chip including a submount a light emitting source attached to the submount and a resin layer covering an outer surface of the light emitting source;
   at least one bump ball provided on the light emitting source and exposed through an upper surface of the resin layer, the at least one bump ball having an upper surface that is substantially coplanar with the upper surface of the resin layer; and
   a package body having an electrode part and the light emitting chip mounted thereon; and
   a metal wire connecting the at least one bump ball with the electrode part.

2. The chip coated LED package according to claim 1, wherein the resin layer contains a fluorescent material for converting the wavelength of light generated from the light emitting source.

3. The chip coated LED package according to claim 1, wherein the electrode part comprises a lead frame integrally provided to the package body.

4. The chip coated LED package according to claim 1, wherein the package body comprises a resin structure which is injection molded with resin to have a cavity formed therein, and wherein the light emitting chip is mounted on the cavity.

5. The chip coated LED package according to claim 1, wherein the cavity comprises a reflecting part disposed on an inner surface of the cavity for reflecting the light generated from the light emitting source.

6. The chip coated LED package according to claim 1, wherein the cavity comprises a filler made of transparent resin filled therein and the package body further comprises a lens provided on an upper part thereof.

7. The chip coated LED package according to claim 1, wherein the package body has a disposition hole formed therein, the disposition hole exposing a metallic chassis with the light emitting chip mounted thereon, and the package body comprises a substrate having the electrode part pattern-printed on an upper surface thereof.

8. The chip coated LED package according to claim 7, wherein the disposition hole comprises a reflecting part disposed on an inner surface of the disposition hole for reflecting the light generated from the light emitting source.

9. The chip coated LED package according to claim 8, wherein the disposition hole comprises a filler made of transparent resin filled therein and the package body further comprises a lens provided on an upper part thereof.

10. The chip coated LED package according to claim 1, wherein the light emitting source has side surfaces and an entire area of the side surfaces is covered with the resin layer.

11. The chip coated LED package according to claim 1, where the side surfaces of the resin layer are substantially coplanar with the side surfaces of the submount, respectively.

12. A light emitting chip including:
    a submount;
    a light emitting source attached to the submount;
    a resin layer covering an outer surface of the light emitting source; and
    at least one bump ball provided on the light emitting source for electrical connection to an external current source and exposed through an upper surface of the resin layer, the at least one bump ball having an upper surface that is substantially coplanar with the upper surface of the resin layer.

13. An illumination device comprising:
    a package body having an electrode part; and
    a light emitting chip mounted on the package body, the light emitting chip including:
    a submount;
    a light emitting source attached to the submount;
    a resin layer covering an upper surface of the light emitting source; and
    at least one bump ball provided on the light emitting source and exposed through an upper surface of the resin layer, the bump ball having an upper surface being substantially coplanar with an upper surface of the resin layer, wherein a first electrode is disposed on the upper surface of the light emitting source and a second electrode is disposed on a lower surface of the light emitting source, wherein an entire portion of the resin layer under which the light emitting source is disposed has a substantially uniform vertical thickness, and wherein the at least one bump ball is connected to the first electrode and the electrode part is electrically connected to the at least one bump ball.

14. The illumination device according to claim 13, wherein the resin layer contains a fluorescent material for converting the wavelength of light generated from the light emitting source.

15. The illumination device according to claim 13, wherein the at least one bump ball have a substantially uniform vertical thickness.

16. The illumination device according to claim 13, wherein the resin layer contacts directly a portion of the upper surface of the light emitting source other than an area of the upper surface of the light emitting source on which the bump ball is disposed.

17. The illumination device according to claim 13, wherein the electrode part comprises a lead frame integrally provided to the package body.

18. The illumination device according to claim 13, wherein the package body comprises a resin structure which is injection molded with resin to have a cavity formed therein, and the light emitting chip is mounted on the cavity.

19. The illumination device according to claim 18, wherein the cavity comprises a reflecting part formed on an inner surface of the cavity for reflecting the light generated from the light emitting source.

20. The illumination device according to claim 18, wherein the cavity comprises a filler made of transparent resin filled therein and the package body further comprises a lens provided on an upper part thereof.

21. The illumination device according to claim 13, wherein the package body comprises a substrate having the electrode part pattern-printed on an upper surface thereof.

22. An illumination device comprising:
a package body having an electrode part; and
a light emitting chip mounted on the package body, the light emitting chip including:
  a submount;
  a light emitting source attached to the submount;
  a resin layer covering an upper surface of the light emitting source; and
  at least one bump ball provided on the light emitting source and exposed through an upper surface of the resin layer, wherein a first electrode is disposed on the upper surface of the light emitting source and a second electrode disposed on a lower surface of the light emitting source,
  wherein an entire portion of the resin layer under which the light emitting source is disposed has a substantially uniform vertical thickness,
  wherein the at least one bump ball are connected to the first electrode and the electrode part is electrically connected to the at least one bump ball, and
  wherein the package body has a disposition hole formed therein, the disposition hole exposing a metallic chassis with the light emitting chip mounted thereon, and the package body comprises a substrate having the electrode part that is pattern printed on an upper surface of the substrate.

23. The illumination device according to claim 22, wherein the disposition hole comprises a reflecting part formed on an inner surface thereof for reflecting the light generated from the light emitting source.

24. An illumination device comprising:
a package body having an electrode part; and
a light emitting chip mounted on the package body, the light emitting chip including:
  a submount;
  a light emitting source attached to the submount;
  a resin layer covering an upper surface of the light emitting source; and
  at least one bump ball provided on the light emitting source and exposed through an upper surface of the resin layer, the bump ball having an upper surface substantially coplanar with an upper surface of the resin layer,
  wherein the resin layer directly contacts a portion of the upper surface of the light emitting source other than an area of the upper surface of the light emitting source on which the bump ball is disposed,
  wherein the electrode part is electrically connected to the at least one bump ball.

25. An illumination device comprising:
a package body having an electrode part; and
a light emitting chip mounted on the package body, the light emitting chip including:
  a submount;
  a light emitting source attached to the submount;
  a resin layer covering an upper surface of the chip die; and
  at least one bump ball provided on the light emitting source and exposed through an upper surface of the resin layer, the bump ball having an upper surface substantially coplanar with an upper surface of the resin layer, wherein an entire portion of the resin layer under which the light emitting source is disposed has a substantially uniform vertical thickness,
  wherein the electrode part is electrically connected to the at least one bump ball.

* * * * *